(12) United States Patent
Lu et al.

(10) Patent No.: US 11,653,580 B2
(45) Date of Patent: *May 16, 2023

(54) NON-VOLATILE MEMORY STRUCTURE WITH POSITIONED DOPING

(71) Applicant: Hefei Reliance Memory Limited, Hefei (CN)

(72) Inventors: Zhichao Lu, San Jose, CA (US); Gary Bela Bronner, Los Altos, CA (US)

(73) Assignee: Hefei Reliance Memory Limited, Hefei (CN)

( * ) Notice: Subject to any disclaimer, the term of this patent is extended or adjusted under 35 U.S.C. 154(b) by 27 days.

This patent is subject to a terminal disclaimer.

(21) Appl. No.: 17/230,273

(22) Filed: Apr. 14, 2021

(65) Prior Publication Data

US 2021/0234093 A1    Jul. 29, 2021

Related U.S. Application Data

(63) Continuation of application No. 16/349,252, filed as application No. PCT/US2017/061394 on Nov. 13, 2017, now Pat. No. 11,018,295.

(Continued)

(51) Int. Cl.
*H01L 21/00* (2006.01)
*H01L 45/00* (2006.01)
*G11C 13/00* (2006.01)

(52) U.S. Cl.
CPC .......... *H01L 45/08* (2013.01); *G11C 13/0007* (2013.01); *G11C 13/0011* (2013.01);
(Continued)

(58) Field of Classification Search
CPC .. H01L 45/08; G11C 13/0007; G11C 13/0011
See application file for complete search history.

(56) References Cited

U.S. PATENT DOCUMENTS 6,235,586 B1    5/2001    Au et al.
8,866,122 B1 *  10/2014   Lee ........................ H01L 45/146
                                                              257/4
(Continued)

FOREIGN PATENT DOCUMENTS

CN    101425559 A    5/2009
CN    101882628 A    11/2010
(Continued)

OTHER PUBLICATIONS

PCT International Search Report and the Written Opinion dated Feb. 20, 2018, issued in related International Application No. PCT/US2017/061394 (8 pages).

(Continued)

*Primary Examiner* — Laura M Menz
(74) *Attorney, Agent, or Firm* — Sheppard Mullin Richter & Hampton LLP

(57) ABSTRACT

Disclosed is a resistive random access memory (RRAM). The RRAM includes a bottom electrode made of tungsten and a switching layer made of hafnium oxide disposed above the bottom electrode, wherein the switching layer includes a filament and one or more lateral regions including a doping material that are between a top region and a bottom region of the switching layer. The RRAM further includes a top electrode disposed above the switching layer.

17 Claims, 3 Drawing Sheets

Related U.S. Application Data

(60) Provisional application No. 62/503,848, filed on May 9, 2017, provisional application No. 62/421,774, filed on Nov. 14, 2016.

(52) U.S. Cl.
CPC ........ *H01L 45/085* (2013.01); *H01L 45/1233* (2013.01); *H01L 45/1253* (2013.01); *H01L 45/14* (2013.01); *H01L 45/143* (2013.01); *H01L 45/146* (2013.01); *H01L 45/1608* (2013.01); *H01L 45/1641* (2013.01); *G11C 2213/50* (2013.01); *G11C 2213/51* (2013.01)

(56) References Cited

U.S. PATENT DOCUMENTS

| | | | |
|---|---|---|---|
| 9,281,475 | B2 | 3/2016 | Chang et al. |
| 9,379,322 | B2 | 6/2016 | Huang et al. |
| 9,722,177 | B2 * | 8/2017 | Molas .................... H01L 45/08 |
| 10,037,801 | B2 * | 7/2018 | Sekar .................. G11C 13/003 |
| 10,186,553 | B2 * | 1/2019 | Wu ..................... H01L 45/1253 |
| 10,199,098 | B2 * | 2/2019 | Sekar ................. G11C 13/0023 |
| 10,224,480 | B2 * | 3/2019 | Rinerson ............... H01L 45/147 |
| 10,340,312 | B2 * | 7/2019 | Chevallier .......... G11C 13/0097 |
| 10,388,372 | B2 * | 8/2019 | Sekar ................. G11C 13/0002 |
| 10,622,062 | B2 * | 4/2020 | Sekar .................. G11C 13/003 |
| 10,777,608 | B2 * | 9/2020 | Lu ........................... G11C 7/12 |
| 10,783,964 | B2 * | 9/2020 | Sekar ................. G11C 13/0097 |
| 10,868,246 | B2 * | 12/2020 | Karpov ............... H01L 45/1233 |
| 10,943,655 | B2 * | 3/2021 | Lu ........................... G11C 29/12 |
| 10,998,044 | B2 * | 5/2021 | Haukness .......... G11C 13/0002 |
| 11,018,295 | B2 * | 5/2021 | Lu ........................... H01L 45/14 |
| 11,081,168 | B2 * | 8/2021 | Zhao ........................ G06F 21/79 |
| 11,342,499 | B2 * | 5/2022 | Glassman ............. H01L 45/146 |
| 11,468,947 | B2 * | 10/2022 | Lu ..................... G11C 13/0028 |
| 2006/0097288 | A1 | 5/2006 | Baek et al. |
| 2009/0289251 | A1 | 11/2009 | Kiyotoshi |
| 2010/0243983 | A1 | 9/2010 | Chiang et al. |
| 2013/0294145 | A1 * | 11/2013 | Sandhu ................. H01L 45/143 438/238 |
| 2014/0322862 | A1 | 10/2014 | Xie et al. |
| 2015/0364679 | A1 * | 12/2015 | Molas ................... H01L 45/085 257/4 |
| 2016/0379710 | A1 * | 12/2016 | Sekar ................. G11C 13/0028 365/148 |
| 2017/0186812 | A1 * | 6/2017 | Lee ..................... H01L 45/1253 |
| 2017/0186948 | A1 * | 6/2017 | Kim .................... H01L 45/1641 |
| 2017/0213958 | A1 * | 7/2017 | Kim ..................... H01L 45/085 |
| 2017/0294580 | A1 * | 10/2017 | Navarro ............. G11C 13/0007 |
| 2018/0330782 | A1 * | 11/2018 | Sekar ................. G11C 13/0097 |
| 2019/0156886 | A1 * | 5/2019 | Sekar ................. G11C 13/0097 |
| 2019/0259945 | A1 * | 8/2019 | Jung ....................... H01L 45/08 |
| 2019/0288037 | A1 * | 9/2019 | Lu ........................ H01L 45/1675 |
| 2019/0288195 | A1 * | 9/2019 | Lu ....................... G11C 13/0007 |
| 2019/0355414 | A1 * | 11/2019 | Sekar .................... G11C 13/004 |
| 2019/0371399 | A1 * | 12/2019 | Haukness .......... G11C 13/0028 |
| 2019/0392897 | A1 * | 12/2019 | Lu ....................... G11C 13/0064 |
| 2020/0211644 | A1 * | 7/2020 | Sekar .................... G11C 13/003 |
| 2020/0343306 | A1 * | 10/2020 | Zhang .................. H01L 27/2418 |
| 2021/0110870 | A1 * | 4/2021 | Lu ........................... G11C 29/12 |
| 2021/0234093 | A1 * | 7/2021 | Lu ........................... H01L 45/14 |

FOREIGN PATENT DOCUMENTS

| | | | | |
|---|---|---|---|---|
| CN | 102683583 | A | | 9/2012 |
| CN | 103117359 | A | | 5/2013 |
| CN | 104183633 | A | | 12/2014 |
| CN | 105206743 | A | | 12/2015 |
| CN | 110114894 | A * | 8/2019 | ........ G11C 13/0007 |
| EP | 2955717 | A1 * | 12/2015 | ........ G11C 13/0011 |
| EP | 2955718 | A1 * | 12/2015 | ........ G11C 13/0011 |
| EP | 2955718 | A1 | | 12/2015 |
| EP | 3539132 | A1 * | 9/2019 | ........ G11C 13/0007 |
| EP | 3539132 | A1 | | 9/2019 |
| EP | 3539132 | A4 | | 11/2019 |
| EP | 3539132 | A4 * | 11/2019 | ........ G11C 13/0007 |
| JP | 2013-125903 | A | | 6/2013 |
| WO | 01/04949 | A1 | | 1/2001 |
| WO | 2013/028376 | A2 | | 2/2013 |
| WO | WO-2018063287 | A1 * | 4/2018 | ............. G11C 13/00 |
| WO | 2018/089937 | A1 | | 5/2018 |
| WO | WO-2018089936 | A1 * | 5/2018 | ........ G11C 13/0007 |
| WO | WO-2018089937 | A1 * | 5/2018 | ........ G11C 13/0007 |
| WO | 2018/089936 | A9 | | 1/2019 |
| WO | WO-2018089936 | A9 * | 1/2019 | ........ G11C 13/0007 |
| WO | WO-2019055052 | A1 * | 3/2019 | ........ G11C 13/0007 |

OTHER PUBLICATIONS

PCT International Preliminary Report on Patentability dated May 23, 2019, issued in related International Application No. PCT/US2017/061394 (7 pages).

First Search dated Oct. 9, 2022, issued in related Chinese Application No. 201780080884.8 (2 pages).

First Office Action dated Oct. 17, 2022, issued in related Chinese Application No. 201780080884.8, with English machine translation (14 pages).

\* cited by examiner

NON-VOLATILE MEMORY STRUCTURE WITH POSITIONED DOPING

CROSS REFERENCE TO RELATED APPLICATIONS

This application is a continuation application of U.S. patent application Ser. No. 16/349,252, filed on May 10, 2019, which is a national stage application under 35 U.S.C. § 371 of International Application No. PCT/US2017/061394, filed on Nov. 13, 2017. International Application No. PCT/US2017/061394 is based on and claims priority to U.S. Provisional Patent Application No. 62/421,774, filed on Nov. 14, 2016, and based on and claims priority to U.S. Provisional Patent Application No. 62/503,848, filed on May 9, 2017. The above-referenced applications are incorporated herein by reference in their entirety.

BACKGROUND

Non-volatile memory is a type of memory device that can store information even after loss of power. Non-volatile memory (NVM) devices can be read only memory, rewriteable memory, random access memory (RAM) or a combination thereof and may use various technologies. One category of non-volatile RAM is resistive RAM, including technologies such as filamentary resistive random access memory (RRAM or ReRAM) cells, interfacial RRAM cells, magnetoresistive RAM (MRAM) cells, phase change memory (PCM) cells (e.g., chalcogenides including alloys of germanium, antimony, and tellurium), memristor memory elements, and programmable metallization cells (e.g., conductive bridging RAM (CBRAM) cell). The RRAM cell is a promising non-volatile memory device for embedded and standalone applications due to its fast operation time and low power performance.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
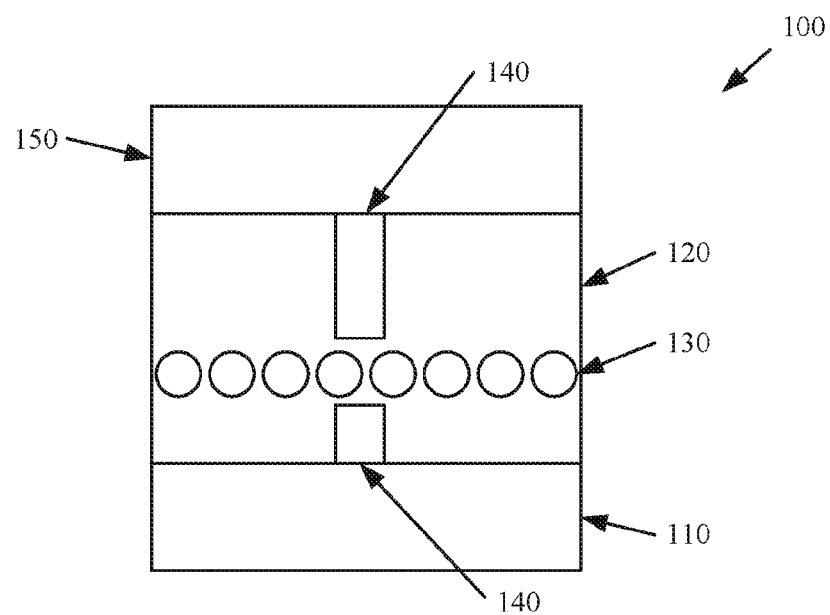
FIG. 1 illustrates a memory structure having a switching layer that includes selectively positioned doping material in accordance with an embodiment.

In the following description, various aspects of the illustrative embodiments will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative embodiments. However, it will be apparent to one skilled in the art that the present disclosure may be practiced without the specific details. In other instances, well-known features are omitted or simplified in order not to obscure the illustrative embodiments. Although various embodiments described herein are described with respect to RRAM cells, in other embodiments, these technologies can be used in other filamentary RAM technologies, including, for example, CBRAM cells, interfacial RRAM cells, MRAM cells, PCM cells, or other programmable metallization cells.

Resistive random-access memory (RRAM) is a type of non-volatile random-access memory. An RRAM structure includes a bottom electrode that is formed of a conductive material. The RRAM structure further includes a switching layer disposed above the bottom electrode. When a voltage is applied to the switching layer, one or more oxygen vacancies may be formed and diffuse through the switching layer so that the oxygen vacancies provide a conductive path across the switching layer. Therefore, the switching layer may be in a low resistance state when oxygen vacancies form a bridging filament between top and bottom electrodes. Conversely, the switching layer may be in a high resistance state when the movement of oxygen vacancies disrupts a filament (e.g., reset). When the filaments are broken, a gap is formed through the movement of oxygen vacancies.

Over time, the oxygen vacancies may reconnect, eliminating the gap in the filament and unintentionally putting the switching layer in a low resistance state from a high resistance state. Conversely, the oxygen molecules may change their location to create oxygen vacancy filaments, unintentionally putting the switching layer from a high resistance state to a low resistance. Therefore, the amount of time data may be stored on the RRAM structure, also referred to as data retention, is dependent on the amount of time the gap in the oxygen vacancy filament can be maintained. Thus, data retention of the RRAM structure may be increased by increasing the amount of time elapsed before the oxygen vacancies reconnect a disrupted filament. One method of increasing the amount of time elapsed before the oxygen vacancies reconnect is adding a doping material to the switching layer. By having the doping material in the switching layer, the oxygen vacancy filament movements are inhibited and the amount of time elapsed before the oxygen vacancies reconnect increases. Thus increasing the data retention of the RRAM structure. However, adding the doping material to the switching layer increases the voltage required to form the oxygen vacancies in the switching layer. The increased forming voltage may require using thicker oxide transistors in the memory structure or limiting the processing use of the RRAM structure.

Embodiments of the present disclosure can address the above-mentioned and other deficiencies by selectively positioning the doping material within the switching layer. Selectively positioning the doping material to correspond with the gap in the oxygen vacancies may increase the data retention of the RRAM structure, improving its performance. Furthermore, because the doping material is only present in a portion of the switching layer rather than the entire switching layer, the other properties of the RRAM structure, such as the voltage required to form the oxygen vacancy filaments, remain the same. Embodiments of the present disclosure may provide other benefits in addition to those previously discussed.

FIG. 1 illustrates a memory structure 100 having a switching layer that includes selectively positioned doping material in accordance with an embodiment. The memory structure 100 may include a bottom electrode 110. In one embodiment, the bottom electrode 110 may be made of a conductive material. Examples of conductive materials include, but are not limited to, copper, gold, silver, tungsten, titanium nitride (TiN), tantalum nitride (TaN), aluminum copper (AlCu), copper telluride (CuTe), graphene or similar materials. A switching layer 120 may be disposed above the bottom electrode 110. The switching layer 120 may be disposed using chemical vapor deposition (CVD), atomic layer deposition (ALD), sputtering or any suitable method as will be discussed in more detail in FIGS. 2 and 3. In one embodiment, the memory structure 100 may be an RRAM structure and the switching layer 120 may be made of a dielectric material, such as a transition metal oxide (TMO). Examples of TMO's include, but are not limited to, stoichiometric Hafnium Oxide (HfOx), stoichiometric Tantalum Oxide (TaOx), stoichiometric Titanium Oxide (TiOx) or other similar materials. In some embodiments, the switching layer 120 may be formed of multiple dielectric layers. The switching layer 120 may include one or more oxygen vacancy filaments 140 that may serve as a conductive path through the switching layer 120. The oxygen vacancy filaments 140 may be formed by applying a voltage to the switching layer 120.

In another embodiment, the memory structure 100 may be a CBRAM structure and the switching layer 120 may be made of a solid electrolyte material. Examples of solid electrolytes include, but are not limited to, yttria-stabilized zirconia (YSZ), beta-alumina solid electrolyte (BASE), Lanthanum trifluoride (LaF$_3$), amorphous silicon, germanium disulfide (GeS$_2$) or other similar materials. In the present embodiment, the switching layer 120 may include ionic filaments rather than oxygen vacancy filaments 140 that may serve as a conductive path through the switching layer 120. The ionic filament may be formed by applying a voltage to the switching layer 120.

The switching layer 120 may have a resistance value, where the resistance value may change upon application of a voltage. For example, the switching layer 120 may switch between a high resistance state and a low resistance state when a voltage is applied. In one embodiment, the high resistance state may be between 100-500 kiloohms and the low resistance state may be between 10-30 kiloohms, inclusively. In some embodiments, a ratio of the high resolution state to the low resistance state may be greater than 1. For example, if the resistance of the high resolution state is 100 kiloohms and the resistance in the low resolution state is 10 kiloohms, the ratio may be 10 (e.g., 100 kiloohms/10 kiloohms). In some embodiments, the ratio of the high resistance state to the low resistance state may be greater than 10.

In some embodiments, the switching layer 120 may be a solid electrolyte material as previously discussed. The high resistance state may be between 100 megaohms and 1 gigaohm, inclusively. The low resistance state may be between 10 kiloohms and 100 kiloohms, inclusively.

A doping material 130 may be selectively positioned within the switching layer 120. In one embodiment, the doping material 130 may be selectively positioned to correspond to a gap in the oxygen vacancy filament 140 to increase the data retention of the memory structure 100. In other embodiments, the doping material 130 may be selectively positioned at any location within the switching layer 120. In one embodiment, the memory structure 100 may be an RRAM structure and the doping material 130 may be Aluminum (Al), Zirconium (Zr), Cadmium (Cd), Gadolinium (Gd), Tantalum (Ta), Tungsten (W), Nickel (Ni), Silicon (Si), Magnesium (Mg), Strontium (Sr), Barium (Ba), Scandium (Sc), Yttrium (Y), Indium (In), Germanium (Ge), Tin (Sn), Titanium (Ti), Hafnium (Hf), Niobium (Nb), Molybdenum (Mo), Antimony (Sb), Tellurium (Te), Thallium (Tl), Lead (Pb), Copper (Cu), Silver (Ag), composite materials or other similar materials. In some embodiments, the memory structure 100 may be a CBRAM structure and the doping material 130 may be Titanium Oxide, antimony (Sb), GeS$_2$ or other similar materials. The doping material 130 may be selectively positioned within the switching layer 120 using CVD, ALD, sputtering or any suitable method.

A top electrode 150 may be disposed above the switching layer 120. The top electrode 150 may be a conductive material. Examples of conductive materials include, but are not limited to, aluminum, copper or any similar materials. The top electrode 150 may be disposed above the resistive layer 120 using CVD, ALD, sputtering or other suitable methods. In some embodiments, the top electrode 150 may be a bit line of the memory structure 100. In other embodiments the top electrode 150 may correspond to a standard metallization layer used for other connections on a semiconductor device.

Figure 2:
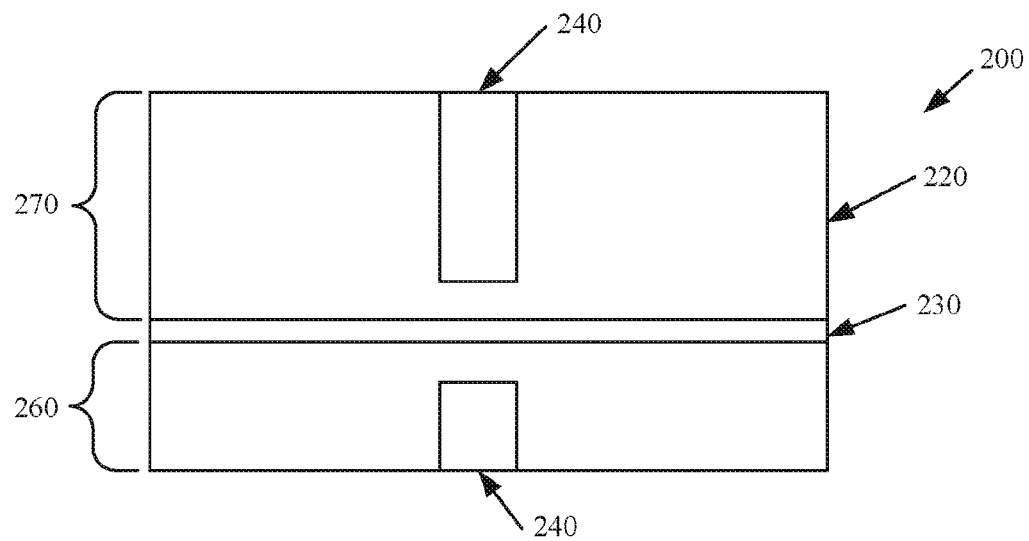
FIG. 2 illustrates a memory structure having a layer of doping material positioned within the switching layer in accordance with an embodiment.

FIG. 2 illustrates a memory structure 200 having a doping layer positioned within the switching layer in accordance with an embodiment. The memory structure 200 includes a switching layer 220 and an oxygen vacancy filament 240 that may correspond to the switching layer 120 and oxygen vacancy filament 140 of FIG. 1, respectively. For illustration purposes, bottom electrode 110 and top electrode 150 are not shown. The memory structure 200 may include a doping layer 230 formed of a material that corresponds to the doping material 130 of FIG. 1. The switching layer 220 may include a bottom region 260 and a top region 270. The switching layer 220 and the doping layer 230 may be disposed using a CVD, ALD, sputtering or other suitable methods. In one embodiment, thin film layers of switching layer 220 material may be sequentially deposited above a bottom electrode using a gas phase chemical process until the thin film layers reach a determined height that corresponds to the desired position of the doping layer 230 within the switching layer 220, which may form the bottom region 260 of the switching layer 220. In another embodiment, multiple gas sources containing different materials may be used at different times of the deposition process to form varying concentrations of the different materials throughout the switching layer 220. In one embodiment, the desired position of the doping layer 230 may correspond to a gap in the oxygen vacancy filament 240. In another embodiment, the desired position of the doping layer 230 may be any position located within the switching layer 220. Once the determined height has been reached, one or more thin film layers of the doping material may be sequentially deposited to form the doping layer 230. After the doping layer 230 has been disposed, additional layers of the switching layer 220 material may be sequentially deposited to form the top region 270 of the switching layer 220.

In one embodiment, the memory structure 200 may be an RRAM structure and the switching layer 220 may be made of a dielectric material, such as a TMO. Examples of TMO's include, but are not limited to, HfOx, TaOx, TiOx or other similar materials. The material of the doping layer 230 may be Al, Zr, Cd, Gd, Ta, W, Ni, Si, Mg, Sr, Ba, Sc, Y, In, Ge, Sn, Ti, Hf, Nb, Mo, Sb, Te, Tl, Pb, Cu, Ag, composite materials or other similar materials. In another embodiment, the memory structure 200 may be a CBRAM structure and the switching layer 220 may be made of a solid electrolyte material. Examples of solid electrolytes include, but are not limited to, YSZ, BASE, LaF$_3$, amorphous silicon, GeS$_2$ or other similar materials. The material of the doping layer 230 may be Titanium Oxide, Sb, GeS$_2$ or other similar materials.

Figure 3:
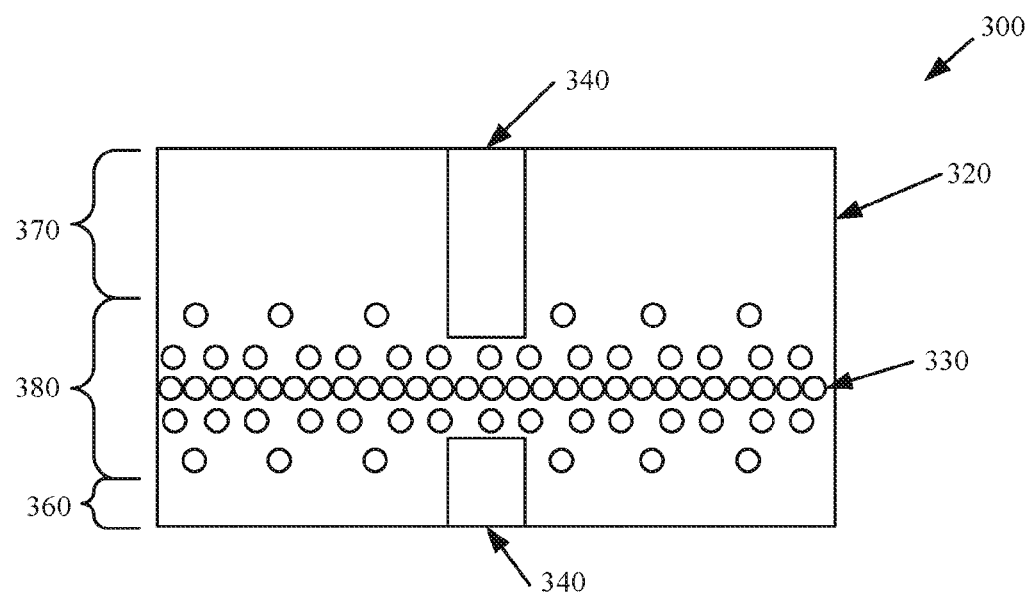
FIG. 3 illustrates a memory structure having a concentration of doping material positioned within the switching layer in accordance with an embodiment.

FIG. 3 illustrates a memory structure 300 having a concentration of doping material positioned within the switching layer in accordance with an embodiment. The memory structure 300 includes a switching layer 320 and an oxygen vacancy filament 340 that may correspond to the switching layer 120 and oxygen vacancy filament 140 of FIG. 1, respectively. For illustration purposes, bottom electrode 110 and top electrode 150 are not shown. The memory structure 300 may include a concentration of doping material 330 that corresponds to the doping material 130 of FIG. 1. The switching layer 320 may include a bottom region 360 and a top region 370. The switching layer 320 and the doping material 330 may be disposed using a CVD, ALD, sputtering or other suitable methods. In one embodiment, thin film layers of switching layer 320 material may be sequentially deposited above a bottom electrode using a gas phase chemical process until the thin film layers reach a determined height that corresponds to the desired position of the layer of doping material 330 within the switching layer 320, which may form the bottom region 360 of the switching layer 320. In another embodiment, multiple gas sources containing different materials may be used at different times of the deposition process to form varying concentrations of the different materials throughout the switching layer 220. In one embodiment, the desired position of the layer of doping material 330 may correspond to a gap in the oxygen vacancy filament 340. In another embodiment, the desired position of the layer of doping material 330 may be any position located within the switching layer 320. Once the determined height has been reached, the doping material 330 may be added to the switching layer 320 material and deposited above the bottom region 360 to form a lateral region 380 that includes a varying concentration of the doping material 330. In one embodiment, the concentration of the doping material 330 may increase until it reaches a maximum value near the center of the lateral region 380. Then, the concentration of the doping material 330 may begin to gradually decrease as subsequent layers are deposited above the center of the lateral region 380. Then, layers of the switching layer 320 material may be deposited that do not include the doping material 330 to form the top region 370 of the switching layer 320.

In one embodiment, the memory structure 300 may be an RRAM structure and the switching layer 320 may be made of a dielectric material, such as a TMO. Examples of TMO's include, but are not limited to, HfOx, TaOx, TiOx or other similar materials. The doping material 330 may be Al, Zr, Cd, Gd, Ta, W, Ni, Si, Mg, Sr, Ba, Sc, Y, In, Ge, Sn, Ti, Hf, Nb, Mo, Sb, Te, Tl, Pb, Cu, Ag, composite materials or other similar materials. In another embodiment, the memory structure 300 may be a CBRAM structure and the switching layer 320 may be made of a solid electrolyte material. Examples of solid electrolytes include, but are not limited to, YSZ, BASE, LaF$_3$, amorphous silicon, GeS$_2$ or other similar materials. The doping material 330 may be Titanium Oxide, Sb, GeS$_2$ or other similar materials.

Figure 4:
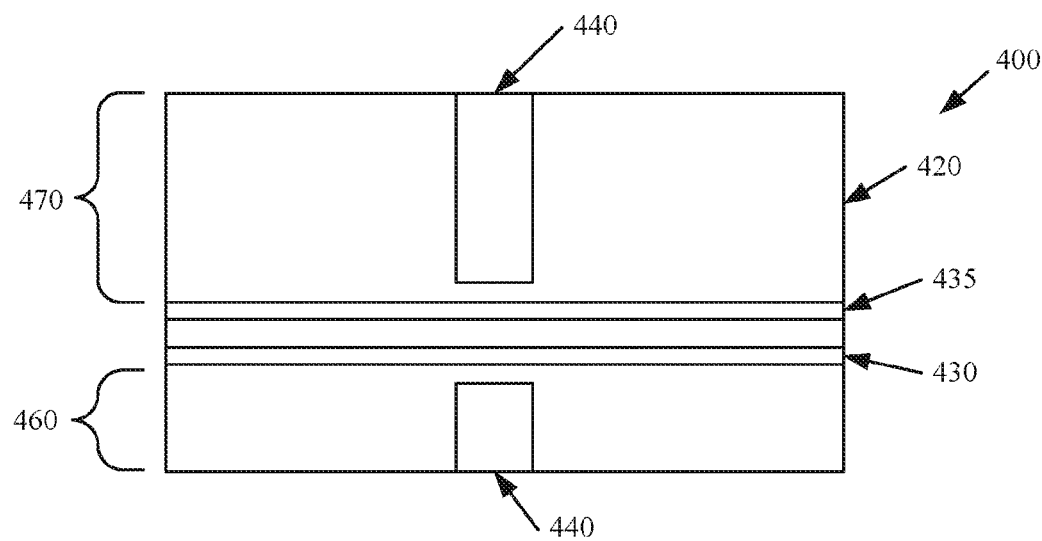
FIG. 4 illustrates a memory structure having multiple doping layers positioned within the switching layer in accordance with an embodiment.

FIG. 4 illustrates a memory structure 400 having multiple doping layers positioned within the switching layer in accordance with an embodiment. The memory structure 400 includes a switching layer 420 and an oxygen vacancy filament 440 that may correspond to the switching layer 120 and oxygen vacancy filament 140 of FIG. 1, respectively. For illustration purposes, bottom electrode 110 and top electrode 150 are not shown. The switching layer 420 may include a first doping layer 430, a second doping layer 435, a bottom region 460 and a top region 470. The switching layer 420, the first doping layer 430 and the second doping layer 435 may be disposed using a CVD, ALD, sputtering or other suitable methods. Thin film layers of switching layer 420 material may be sequentially deposited above a bottom electrode using a gas phase chemical process until the thin film layers reach a determined height that corresponds to the desired position of the first doping layer 430 within the switching layer 420, which may form the bottom region 460 of the switching layer 420. In one embodiment, the desired position of the first doping layer 430 may correspond to a gap in the oxygen vacancy filament 440. In another embodiment, the desired position of the first doping layer 430 may be any position located within the switching layer 420. Once the determined height has been reached, one or more thin film layers of the doping material may be sequentially deposited to form the first doping layer 430.

In one embodiment, the memory structure 400 may be an RRAM structure and the switching layer 420 may be made of a dielectric material, such as a TMO. Examples of TMO's include, but are not limited to, HfOx, TaOx, TiOx or other similar materials. The material of the first doping layer 430 may be Al, Zr, Cd, Gd, Ta, W, Ni, Si, Mg, Sr, Ba, Sc, Y, In, Ge, Sn, Ti, Hf, Nb, Mo, Sb, Te, Tl, Pb, Cu, Ag, composite materials or other similar materials. In another embodiment, the memory structure 400 may be a CBRAM structure and the switching layer 420 may be made of a solid electrolyte material. Examples of solid electrolytes include, but are not limited to, YSZ, BASE, LaF$_3$, amorphous silicon, GeS$_2$ or other similar materials. The material of the first doping layer 430 may be Titanium Oxide, Sb, GeS$_2$ or other similar materials.

In one embodiment, after the first layer of doping material 430 has been deposited, layers of the switching layer 420 material may be sequentially deposited above the first layer of doping material 430 prior to disposing a second doping layer 435 forming a layer of switching layer 420 material between the first doping layer 430 and the second doping layer 435. In another embodiment, the second doping layer 435 may be disposed directly above the first layer of doping material 430. The second layer of doping material 435 may be disposed using a CVD, ALD, sputtering or other suitable methods. In one embodiment, the material of the second doping layer 435 may be the same as the material of the first doping layer 430. In another embodiment, the material of the second doping layer 435 may be any suitable material that is different than the material of the first doping layer 430. Once the second doping layer 435 has been disposed, switching layer 420 material may be disposed above the second doping layer 435 to form the top region 470 of the switching layer 420. In some embodiments, the doping material of the first doping layer 430 and the doping material of the second doping layer 435 may diffuse to adjacent layers of the switching layer 420. This may result in the switching layer 420 material between the first doping layer 430 and the second doping layer 435 having concentrations of the doping material of the first doping layer 430 and the doping material of the second doping layer 435.

Although memory structure 400 is illustrated as having multiple doping layers, in other embodiments memory structure may have multiple lateral regions containing varying concentrations of one or more doping materials, as described in FIG. 3. Furthermore, although memory structure 400 is illustrated as having a first doping layer 430 and a second doping layer 435, in other embodiments the memory structure 400 may include any number of doping layers located within switching layer 420.

Figure 5:
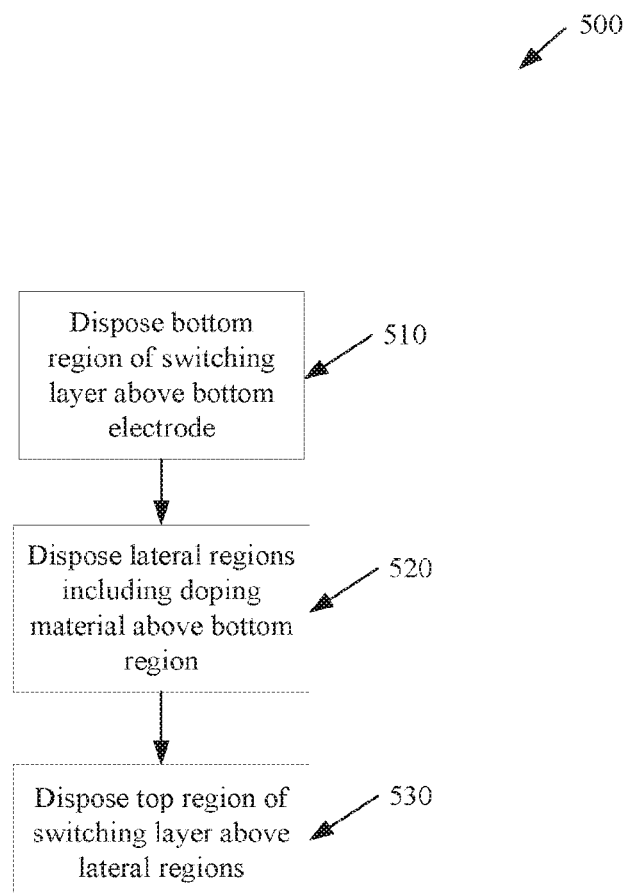
FIG. 5 is a flow diagram of a fabrication process for the manufacture of a memory structure in accordance with an embodiment.

FIG. 5 is a flow diagram of a fabrication process for the manufacture of a memory structure in accordance with an embodiment. It may be noted that elements of FIGS. 1-4 may be described below to help illustrate method 500. Method 500 may be performed as one or more operations. It may be noted that method 500 may be performed in any order and may include the same, more or fewer operations. It may be noted that method 500 may be performed by one or more pieces of semiconductor fabrication equipment or fabrication tools.

Method 500 begins at block 510 by disposing a bottom region of a switching layer above a bottom electrode. The switching layer may be disposed by CVD, ALD, sputtering or other suitable methods. In one embodiment, the switching layer may be a dielectric material such as HfOx, TaOx, TiOx or any suitable material. In another embodiment, the switching layer may be a solid electrolyte such as YSZ, BASE, LaF$_3$ or other similar materials. At block 420, a one or more lateral regions including doping material may be disposed above the bottom region. The lateral regions may be disposed by CVD, ALD, sputtering or other suitable methods. In one embodiment, the lateral regions may be one or more doping layers as described in FIGS. 2 and 4. In another embodiment, the lateral regions may be one or more regions having varying concentrations of doping material FIGS. 3 and 4. At block 430, a top region of the switching layer may be disposed above the lateral regions. The top region may be disposed by CVD, ALD, sputtering or any suitable process.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

What is claimed is:

1. A memory device comprising:
   a bottom electrode;
   a switching layer comprised of a material disposed above the bottom electrode, the switching layer comprising one or more lateral regions that include a doping material, wherein the one or more lateral regions are positioned between a top region and a bottom region of the switching layer; and
   a top electrode disposed above the switching layer;
   wherein a filament is formed in the switching layer between the top region and the bottom region of the switching layer upon application of a first voltage between the top electrode and the bottom electrode;
   wherein a gap in the filament is formed upon application of a second voltage between the top electrode and the bottom electrode; and
   wherein a location of the one or more lateral regions within the switching layer corresponds to the gap in the filament.

2. The memory device of claim 1, wherein the memory device is a resistive random access memory (RRAM) device.

3. The memory device of claim 2, wherein the material of the switching layer comprises a transition metal oxide.

4. The memory device of claim 3, wherein the transition metal oxide comprises at least one of HfOx, TaOx, or TiOx.

5. The memory device of claim 2, wherein the doping material comprises at least one of Al, Zr, Cd, Gd, Ta, W, Ni, Si, Mg, Sr, Ba, Sc, Y, In, Ge, Sn, Ti, Hf, Nb, Mo, Sb, Te, Tl, Pb, Cu, or Ag.

6. The memory device of claim 1, wherein the memory device is a conductive bridging random access memory (CBRAM) device.

7. The memory device of claim 6, wherein the material of the switching layer comprises a solid electrolyte.

8. The memory device of claim 7, wherein the solid electrolyte comprises at least one of YSZ, BASE, LaF3, amorphous silicon, or GeS2.

9. The memory device of claim 6, wherein the doping material comprises at least one of TiOx, Sb, or GeS2.

10. The memory device of claim 6, wherein the filament is an ionic filament.

11. The memory device of claim 1, wherein the filament is an ionic filament.

12. The memory device of claim 1, wherein the one or more lateral regions comprises a planar sheet of the doping material.

13. The memory device of claim 1, wherein the one or more lateral regions comprise:
   a first lateral region comprised of the doping material; and
   a second lateral region comprised of a second doping material that is different than the first doping material.

14. The memory device of claim 13, wherein:
   the first lateral region includes the doping material at a first concentration; and
   the second lateral region includes the second doping material at a second concentration that is different than the first concentration.

15. The memory device of claim 1, wherein the one or more lateral regions comprise:
   a first lateral region comprised of the doping material; and
   a second lateral region comprised of the doping material.

16. The memory device of claim 15, wherein:
   the first lateral region includes the doping material at a first concentration; and
   the second lateral region includes the doping material at a second concentration that is different than the first concentration.

17. The memory device of claim 1, wherein a concentration of the doping material in the one or more lateral regions increases near a center of each of the one or more lateral regions.

* * * * *

UNITED STATES PATENT AND TRADEMARK OFFICE
CERTIFICATE OF CORRECTION

PATENT NO. : 11,653,580 B2
APPLICATION NO. : 17/230273
DATED : May 16, 2023
INVENTOR(S) : Zhichao Lu and Gary Bela Bronner It is certified that error appears in the above-identified patent and that said Letters Patent is hereby corrected as shown below:

On the Title Page

In the (63) Related U.S. Application Data:
"(63) Continuation of application No. 16/349,252, filed as application No. PCT/US2017/061394 on Nov. 13, 2017, now Pat. No. 11,018,295."

Should read:
-- (63) Continuation of application No. 16/349,252, filed on May 10, 2019, now Pat. No. 11,018,295, which is a 371 of application No. PCT/US2017/061394 filed on Nov. 13, 2017. --

Signed and Sealed this
Second Day of July, 2024

Katherine Kelly Vidal
*Director of the United States Patent and Trademark Office*